United States Patent [19]

Miron et al.

[11] Patent Number: 4,791,597

[45] Date of Patent: Dec. 13, 1988

[54] MULTIPLIERLESS FIR DIGITAL FILTER WITH TWO TO THE NTH POWER COEFFICIENTS

[75] Inventors: Amihai Miron, Ossining; David Koo, Briarcliff Manor, both of N.Y.

[73] Assignee: North American Philips Corporation, New York, N.Y.

[21] Appl. No.: 923,534

[22] Filed: Oct. 27, 1986

[51] Int. Cl.$^4$ .......................................... G06F 15/31
[52] U.S. Cl. ................................................ 364/724.03
[58] Field of Search ........................................... 364/724

[56] References Cited

U.S. PATENT DOCUMENTS

| | | | |
|---|---|---|---|
| 3,665,171 | 5/1972 | Morrow | 364/724 |
| 3,696,235 | 10/1972 | Tufts et al. | 364/724 |
| 3,979,701 | 9/1976 | Tomozawa | 333/70 T |
| 3,988,606 | 10/1976 | Eggermont | 364/724 |
| 4,185,325 | 1/1980 | Appel | 364/724 |
| 4,649,507 | 3/1987 | Inaba et al. | 364/724 |

Primary Examiner—David H. Malzahn
Attorney, Agent, or Firm—Thomas A. Briody; Jack E. Haken; Leroy Eason

[57] ABSTRACT

A multiplierless digital FIR filter comprising a plurality of serially cascaded stages providing a non-linear series of two to the Nth power coefficient values, and in which quantization error is reduced by scaling the coefficient values to minimize root mean square error. Each stage includes a basic unit and an incremental unit, the basic unit providing two shift operations and including a delay element and an adder. To achieve a particular quantization error, one or more incremental units are connected in series with the basic unit in each stage, each such incremental unit providing a single shift operation and including a delay element and an adder. The number of incremental units in each stage and the number of cascaded stages can be selected to achieve a filter having desired performance characteristics and which can be realized on a VLSI chip.

5 Claims, 2 Drawing Sheets

MULTIPLIERLESS FIR DIGITAL FILTER WITH TWO TO THE NTH POWER COEFFICIENTS

BACKGROUND OF THE INVENTION

1. Field of the Invention

This invention pertains to the field of non-recursive digital filters used for digital signal processing and real time digital video processing. In particular it pertains to finite impulse response (FIR) filters which do not require multipliers in their realization, usually in the form of large scale integrated (LSI) or very large scale integrated (VLSI) circuits.

2. Description of the Prior Art

Finite impulse response (FIR) digital filters are widely used in digital signal processing, as well as in real-time digital video processing. The conventional hardware realization of an FIR digital filter utilizes the basic functional components of delay units, multipliers and adders. Among these basic functional components, multipliers are generally the most complex for hardware realization, and occupy large "real estate" area, which increases the cost of the filter. The cost of multipliers in discrete component systems is high. From the point of view of VLSI chip design, the area occupied by a multiplier on an IC filter chip is too large. Cost is not the only important factor; but the operational speed of a filter is even more significant in a variety of applications; for example, in real-time video processing and other high speed digital signal processing. In the conventional FIR digital filter, a high percentage of the propagation delay time is due to multipliers, which reduce the speed of the filter. Therefore, to improve the operational speed, reduce the cost and simplify the structural complexity for VLSI chip design, it is desirable to eliminate time-consuming multipliers from digital FIR filters.

Current technical literature includes numerous articles directed toward the reduction or elimination of multipliers in the architecture or design of FIR digital filters, while at the same time proposing solutions directed to increasing the speed of these filters for use in real time digital signal processing applications.

In the prior patent art, U.S. Pat. No. 3,979,701 discloses a non-recursive digital filter composed of a cascaded plurality of basic sections, each of which is characterized by coefficient values of integer powers of two's. The filter of this patent uses no multipliers and claims an operating speed several times faster than other filters which utilize multipliers.

The multiplierless FIR filter disclosed in this application has certain concepts which appear to be similar to those of U.S. Pat. No. 3,979,701 but there are important differences.

The filter described in U.S. Pat. No. 3,979,701 has two basic building blocks from which the filter is constructed: Type 1 and Type 2. The Type 1 unit has only coefficients with a value of 1 (see line 53 to line 56 of column 3 of U.S. Pat. No. 3,979,701); the Type 2 unit has only an even number of delay elements and only three coefficients, the center coefficient value of which is always equal to 1 (see line 7 to line 12 of column 4 of U.S. Pat. No. 3,979,701).

SUMMARY OF THE INVENTION

The invention pertains to the architecture of a digital filter which contains no multipliers. In conventional digital filter design, the filter coefficients are linearly quantized to two to the Nth power different levels. Multipliers are a necessity in conventional designs. In multiplier-free digital filter design, the filter coefficients are non-linearly quantized to N different levels, each one of which represents a number equal to two to the Nth power. Multipliers may be replaced by shift registers and/or multiplexers in this non-conventional design.

The invention is directed to solving at the architectural level the major difficulty in the design of multiplier-free digital filters, namely the reduction of the non-linear quantization error in order to reach a desired filter performance specification. The architecture of the present invention permits the non-linear quantization error to be optimized by scaling the value of the coefficients to minimize the root mean square error. This optimization is made possible by the filter architecture disclosed which uses a particular type of flexible filter structure.

The non-recursive digital FIR filter of this application uses a cascading of m stages, that is, the output data of stage 1 is fed into the input of stage 2 and the same is done with the other stages up to stage m, as shown in FIG. 1. Each stage is characterized by coefficient values of integer powers of twos. In binary arithmetic, multiplication with an integer twos power is simply made by shifting, and hence no multiplier is necessary. In each stage, the transversal FIR filter operation is performed without the use of multipliers. Instead, the input data is shifted according to the coefficient value by using shift registers, multiplexers or direct wiring.

Each of the filter's stages is structured by using two building blocks. The first building block has two shift operations, one delay unit and one adder, as shown in FIG. 2, the minimum hardware that every stage must have. To improve the performance of each stage and the overall performance of the filter, a second building block can be added. The second building block is always one delay unit, one shift operation and one adder, as shown in FIG. 3. The second building block is added to the first block by a simple connection at two points. It is possible to add as many second building blocks to each stage as required for a specific application. Each stage may have a different number of the second building blocks, but it always has one first building block.

The primary object of the present invention is to provide a very fast non-recursive digital filter in which no multipliers are required and in which the operating speed is improved to satisfy the requirements of real time digital signal processing.

A second object of the invention is to decrease the spaced required for such a filter on an integrated circuit chip, thereby decreasing the cost of the filter, and decreasing its complexity.

DESCRIPTION OF THE PREFERRED EMBODIMENT

Figure 1:
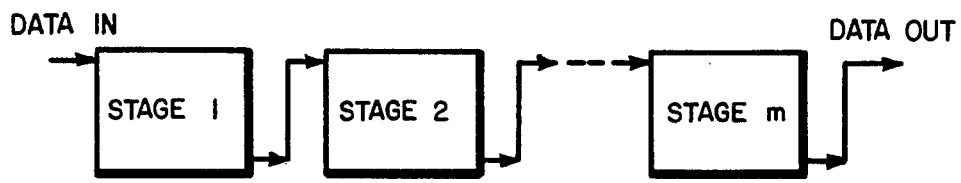
FIG. 1 is a functional block diagram showing the basic design of the Two to the Nth Power filter of the present invention.

The present invention pertains to a novel design for a high performance FIR digital filter having cascaded stages, each stage having only two to the Nth power coefficients.

The FIR digital filter is a digital calculation device which performs the following convolution:

$$y(n) = \sum_{k=0}^{K-1} x(n-k)c(k) \quad (1)$$

where
  x(n), is the input sequence,
  y(n), the output sequence,
  c(k), the filter coefficient sequence,
  K, the number of coefficients in the filter.

K is also the number of taps per stage. From the above expression, it is shown that K multiplications are needed for each output sample. For practical hardware realization, at least $(K-1)/2$ multipliers are needed in a conventional FIR digital filter structure (where K is odd). These multipliers degrade the filters' speed and performance, and cause the filter to be complex and expensive.

The basic structure of the filter architecture of the present invention is shown in FIGS. 1 through 4. The filter has m cascaded stages and each stage has only two to the Nth power coefficients. Generally, the number of taps in each stage is not the same and depends on the filter characteristics and design procedure. If properly designed, the filter shown in these figures and the conventional FIR digital filter will perform similarly.

The coefficients of a conventional digital filter are usually the quantized values of the "ideal" coefficients which are linearly quantized to N different levels which belong to the set of real numbers.

The "two to the Nth power coefficient" FIR digital filter has coefficients which are nonlinearly quantized to N different levels and which belong to the set of two to the Nth power. Instead of multipliers, the filter uses multiplexers or even direct wiring to perform the shift operation, illustrated in FIG. 5. Therefore, the filtering speed is increased drastically. There are two major difficulties in designing such a filter—the quantization error and the coefficient design method. The quantization error is the most difficult. In the present invention this error is optimized by scaling the value of the coefficients to minimize the root mean square error. The quantization error of the ith coefficient in a digital filter is defined as $$\hat{e}(i) = c_q(i) - c(i) \quad (2)$$

where
  c(i), is the ith sample of the ideal coefficient sequence,
  $c_q(i)$, the ith sample of the quantized coefficient sequence c(n).

In other words $c_q(n)$ is the actual impulse response sequence $C_q(n)$ of the filter. The frequency response of that filter will be the Fourier transform of $C_q(n)$, that is $$\begin{aligned} H_q(\omega) &= \sum_{n=0}^{K-1} c_q(n) e^{-jn\omega} \\ &= \sum_{n=0}^{K-1} c(n) e^{-jn\omega} + \sum_{n=0}^{K-1} \hat{e}(n) e^{-jn\omega} \\ &= H(\omega) + \hat{E}(\omega) \end{aligned} \quad (3)$$

where
  H(w), is the ideal required frequency response of the filter,
  Ê(w), the additive error introduced in the frequency domain due to quantization error.

From equation (3), we can see that the frequency response of a physical digital filter is the result of adding a frequency domain error to the ideal frequency response. That frequency domain error is the unique Fourier transform of the filter coefficient quantization error.

Now consider the total square error in the time (coefficients) domain due to the quantization $$\hat{e}_t = \left| \sum_{i=0}^{K-1} \hat{e}(i) \delta(t-i) \right|^2 \quad (4)$$

where
  $\hat{e}_t$, is the total square error in time domain,
  ê(i), the quantization error of the i th coefficient,
  K, the number of coefficient in a single stage filter,
  $\delta(t-i)$, the impulse function at t=i.

Parseval's theorem shows the direct relationship between the frequency domain and the time domain square error $$\hat{E}_t = \frac{1}{2\pi} \int_{-\infty}^{\infty} |\hat{E}(\omega)|^2 d\omega = \quad (5)$$

$$\int_{-\infty}^{\infty} \left| \sum_{i=0}^{K-1} \hat{e}(i) \delta(t-i) \right|^2 dt = \hat{e}_t$$

where $\hat{E}_t$, is the total square error in frequency domain.

The relationship in (5) suggests a direct influence of the frequency domain error correction on the time domain corresponding adjustment needed for better frequency response. Because there are only 2L+1 quantization levels (here L stands for the highest integer exponential of 2 in the quantization) of the two to the Nth power coefficients and the levels are nonlinearly scaled, the quantization error of such type of filter will be so large that a good filtering result cannot be obtained by simply applying the conventional single stage FIR structure to the two to the Nth power coefficient filter.

The quantization error of the two to the Nth power coefficient filter is very large, but is is possible to reduce that error by properly using "cascading" and other techniques. Hence, the invention uses a cascading of m stages. The cascading technique is widely used in many fields. A few years ago, Kaiser and Hamming mentioned cascading in conventional digital filter designs. Because in the two to the Nth power coefficient filter design, the goal is not to use multipliers in any inner branches of the filter, the polynominal-cascading approach of Kaiser and Hamming cannot be used in this invention. Alternatively, this architecture uses the technique of cascading different filter stages or cascading the same filter stages. In both cases, two to the Nth power coefficient stages are employed.

Let us first consider our ideal filter coefficients, c(n). The ideal coefficients c(n) belong to the set of real numbers, R.

$$c(n) \in R. \tag{6}$$

The coefficients in the set R can most precisely represent the coefficients in the filter whose response approximates the required transfer function.

Any quantized coefficient belongs to a certain finite set. The two to the Nth power coefficients belong to a very small finite set, the set of power of two, which we called TL here. The L stands for the highest integer exponential of 2 in the set.

$$C_{iq}(n) \in T_L \; i=1, 2, \ldots, m; \; L=1, 2, 3, \ldots \tag{7}$$

Therefore the single stage of that filter has neither good precision nor much freedom. But cascading stages make it possible to reduce the error in h(n). The h(n) is the impulse response to the filter.

Cascading two or more filter stages is a simplified way of performing the time domain convolution without extra multipliers. It is that type of "natural" convolution that the invention can take advantage of.

For a filter with two cascaded stages, the convolution of the two coefficient sequences is the impulse response of the filter, that is, the impulse response of the whole filter.

$$h(n) = c_{1q}(n) * c_{2q}(n) = \sum_{k=0}^{n} c_{1q}(n-k) c_{2q}(k) \tag{8}$$

And for a multiple stage filter having m stages where m>2, a similar result is reached.

$$h(n) = c_{1q}(n) * c_{2q}(n) * \ldots * c_{mq}(n) \tag{9}$$

where h(n), is the impulse response of the filter, $c_{iq}(n)$, i=1, 2, ..., m, the ith stage coefficient sequence.

Generally, the set TL is not a closed set under the operation of convolution. This is extremely important to us.

Under the operation of convolution, the resulting elements will be spread out far from Tn and form a much larger set which we call V. The more stages that are cascaded, the larger the resultant set V will be expanded. Therefore h(n) belongs to V.

$$h(n) \in V \tag{10}$$

and, of course, V is in R.

$$V \subset R. \tag{11}$$

When V becomes large, h(n) can be chosen with sufficient accuracy. If now we can properly adjust h(n), it will represent the impulse response with very little error compared to the ideal response.

Figure 2:
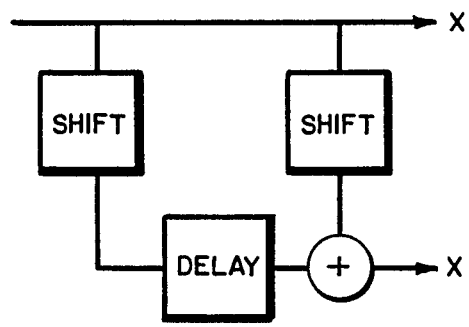
FIG. 2 is a block diagram of the minimum configuration or basic unit for one stage of the filter of FIG. 1.
Figure 3:
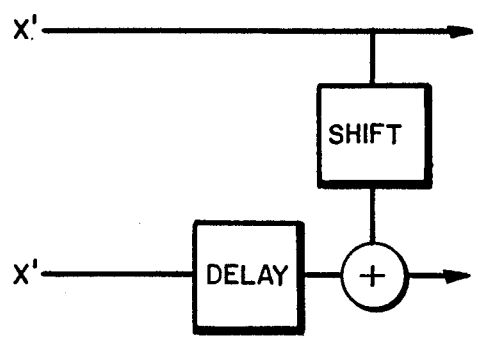
FIG. 3 is a block diagram of an incremental unit which may be added to the minimum configuration of FIG. 2 to create a longer stage.
Figure 4:
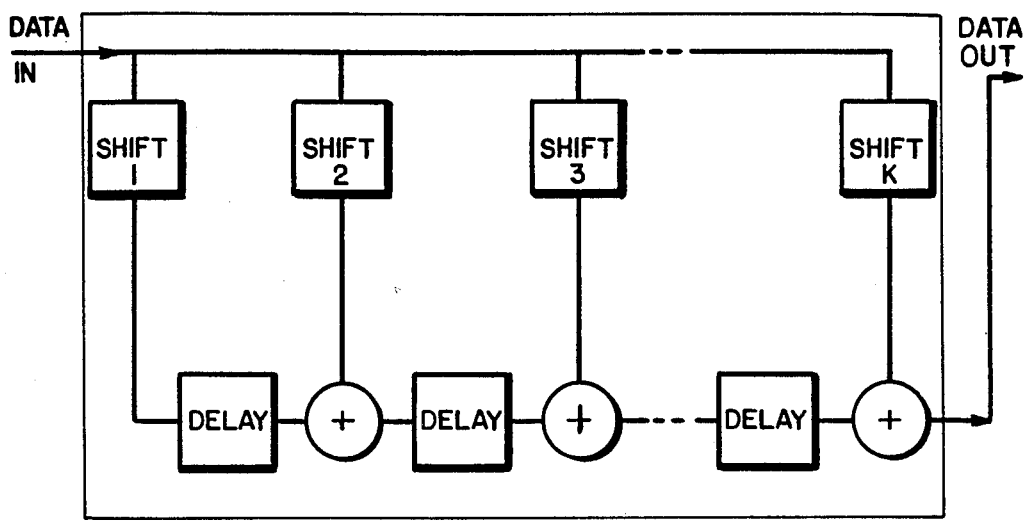
FIG. 4 is a block diagram of one stage of the filter of FIG. 1 using the basic unit of FIG. 2 and a plurality of incremental units of FIG. 3.

The adjustment of h(n) for the design of a filter for a specific application involves the application of the basic equations to the problem and applying the results to utilization of the basic and incremental configurations of FIGS. 1, 2 and 3. The cascading of stages, shown in FIG. 1, combined with dividing the number of required taps among the stages, will serve to minimize the quantization error. The basic configuration of a stage, as shown in FIG. 2, includes only two taps. Additional taps are provided by adding incremental units shown in FIG. 3, one incremental unit per tap. FIG. 4 illustrates a single stage having K taps.

Now we can see that reducing the large error of two to the Nth power quantization is possible by using the convolution of the coefficient squences through proper coefficient design.

As systems go digital, the use of the FIR filter becomes a desired designer option for the linear phase high performance digital filter. To make this alternative practical, it has to be integrated in the form of VLSI. For video applications the bus width of the digital data is 8 bits and the coefficients have 4 to 8 bits. The critical requirement for the digital video filter is the speed or the highest frequency it can operate in. Acceptable frequency is 4 times the NTSC color subcarrier (14.3 MHz) and higher.

The direct way to implement the convolution sum [Eq.(1)] to use (K−1)/2 multipliers for the K taps FIR filter. However, this solution does not take the advantage of the fact that in most digital filtering applications there is no need to alter the coefficient every clock cycle. When this concept is realized and we bit-slice the architecture of the filter, we can improve the multiplication time but we do not gain that much in terms of chip area or equivalent gates (the measurement that we will use). The designer goal is to achieve maximum performance from a filter by using the least number of components.

Figure 5:
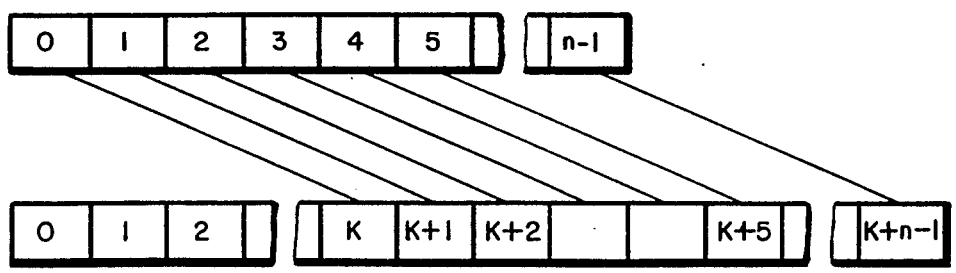
FIG. 5 is a diagrammatic illustration of a shift operation for two to the (−k) power coefficient.

The simplicity of the shift operation as compared with multiplication is obvious in FIG. 5. FIG. 5 shows a shift by k operation or in other words, implementation of two to the −k power coefficient. Every shift operation can be different in the number of bits that the input data is shifted by and can vary from to 0 to n−1.

By using the Two to the Nth power coefficient we do two things:

We give up precision, in each separate tap, to the filter coefficient

We reduce the equivalent gate count needed for each tap of the filter.

To evaluate the benefit of using the Two to the Nth power coefficient, the trade-off between these two opposing results has to be examined.

The reduction in the equivalent gate count is easier to evaluate. By evaluating different architectures described in current literature and the architecture of FIGS. 1 to 4, we conclude that the equivalent gate count is reduced by at least a factor of four for the same number of taps in a given filter that can handle negative coefficients.

We also need to examine what penalty we have to pay in terms of additional taps to compensate for the lack of accuracy in the coefficient. As discussed, the degree of freedom in our approach increases sharply with the number of taps and cascading stages. It is obvious that the lower bound on the number of taps will be the number of taps required to implement the same filter with "full precision" coefficient (quantized to finite number of levels). The other important observation is that for a useful FIR filter in video applications requires around 17 or more taps of "full precision" coefficients.

If we could come up with a filter based on Two to the Nth power that requires less then twice the number of taps required for the "full precision" realization, we would achieve a substantial saving in equivalent gates and as such a cheaper system solution (fewer IC's to implement a given performance). This saving is the result of lower equivalent gates count in each of the taps compared to other architectures. For the evaluation of the saving in equivalent gates, we will define a saving factor S $$S = \frac{K_f}{K_2} \cdot \frac{EG_f}{EG_2} \qquad (24)$$

where
- $K_f$, is the number of taps for full precision coefficients,
- $EG_f$, the number of equivalent gates for full precision coefficient,
- $K_2$, the number of taps for Two to the Nth power coefficients,
- $EG_2$, the number of equivalent gates for Two to the Nth power coefficients, The ratio $EG_f/EG_2$ is a fixed ratio for a given architecture and depends on the structure compared to the Two to the Nth power realization.

The ratio $K_f/K_2$ is dependent on the number of taps in the filter. This ratio varies from 1/2 for small number of taps and approaches 1 for an increasing number of taps.

Although time domain coefficients convolution or cascading of stages makes it possible to reduce the quantization error, the proper design of coefficients of each filter stage through the use of an error reduction procedure is also essential to good filter design for a specific application. The solution to this problem is beyond the scope of the present invention and does not affect the architecture of the filter as disclosed and claimed herein.

Preliminary studies suggest that a 15-tap filter can be integrated on one IC using a 2 micron double metal CMOS standard cells. This filter will have programmable coefficients and a programmable internal cascading structure. The selection of the coefficients' value and the internal cascading points are the result of a software package. It is easy to see that for specific applications with fixed filtering characteristics, the equivalent gate count ($EG_2$), can be cut by a factor of two. This saving will be achieved by giving up the programmability of the filter and by performing the shift operation by hard wiring, as shown in FIG. 5.

Through the study of the design and the performance of this architecture for a two to the Nth power coefficient digital filter, we believe that high performance filters with a reasonable number of taps are achievable by using the above described design.

From the filtering performance point of view, this class of two to the Nth power coefficient filters can have the same performance as the conventional optimized filters with the same number of taps when there are good enough taps. Beyond that, the processing speed of this class of filters will be much higher than the conventional digital filter. The design of the filter is straightforward when applying the cascading "local correlation" and "windowing" methods. The "local correlation" is a particularly efficient design method which, we believe, can be used not only in the design of the two to the Nth power coefficient filter but also in the design conventional digital filters to reduce the error in the specified regions.

From the system realization point of view, the proposed architecture provides a fast, video rate operation without the cost of complex hardware; a substantial number of taps can be integrated on a single IC using simple building blocks. It is our belief that by using the right software, we can simplify the hardware and still maintain the functionality and performance.

What is claimed is:

1. A non-recursive digital filter comprising:
    at least one stage which includes a basic unit and a plurality of incremental units serially connected thereto;
    said basic unit comprising:
        a data word input line having at least two taps;
        first shift means connected to a first of said taps to receive and shift a data input word on said input line and having an output at which such first shifted data word is produced, the extent of said first shift establishing a coefficient value at said first tap which is an integer power of two;
        delay means connected to the output of said first shift means for delaying the first shifted data word;
        second shift means connected to a second of said taps to receive and shift said data input word on said input line and having an output at which such second shifted data word is produced, the extent of said second shift establishing a coefficient value at said second tap which is an integer power of two; and
        adding means connected to said delay means and to the output of said second shift means for deriving the sum of said delayed first shifted data word and said second shifted data word, such sum being a data output word of said basic unit;
    said incremental units increasing the number "k" of taps of said basic unit, the ith of such incremental units ($2 < i < k$) comprising:
        delay means for receiving and delaying a data word received at a first input of such ith incremental unit;
        ith shift means connected to an ith additional tap on said input line to receive and shift said data input word thereon and having an output at which such shifted data word is produced, the extent of such ith shift establishing a coefficient value at said ith tap which is an integer power of 2; and
        adding means connected to said delay means of said incremental unit and to the output of said ith shift means for deriving the sum of said delayed data word received at said first input and said ith shifted data word, such sum being a data output word of said ith incremental unit;
    said incremental units being serially connected so that the data word received at said first input of a succeeding unit is the data output word of the immediately preceding unit, the data output word produced by the last unit being the data output word of said stage of said filter.

2. The digital filter of claim 1, comprising a plurality of said stages connected in series so that the data input word to any stage is the data output word of the immediately preceding stage, the data output word of the last stage being the data output word of the digital filter.

3. The digital filter of claim 1 or 2, in which each of said shift means is hardwired.

4. The digital filter of claim 1 or 2, in which each of said shift means is programmable.

5. The digital filter of claim 1 or 2, in which each of said shift means can shift the data input word to the right and/or left by any number of bit positions.

* * * * *